(12) United States Patent
An (10) Patent No.: US 10,260,397 B2
(45) Date of Patent: Apr. 16, 2019

(54) THERMOELECTRIC GENERATING APPARATUS OF VEHICLE AND METHOD FOR CONTROLLING THE SAME

(71) Applicants: Hyundai Motor Company, Seoul (KR); Kia Motors Corporation, Seoul (KR)

(72) Inventor: Hochan An, Hwaseong-si (KR)

(73) Assignees: Hyundai Motor Company, Seoul (KR); Kia Motors Corporation, Seoul (KR)

(*) Notice: Subject to any disclaimer, the term of this patent is extended or adjusted under 35 U.S.C. 154(b) by 0 days.

(21) Appl. No.: 15/613,672

(22) Filed: Jun. 5, 2017

(65) Prior Publication Data

US 2018/0187587 A1 Jul. 5, 2018

(30) Foreign Application Priority Data

Dec. 29, 2016 (KR) .................... 10-2016-0181837

(51) Int. Cl.
*F01N 5/02* (2006.01)
*H01L 35/30* (2006.01)
*H01L 35/32* (2006.01)

(52) U.S. Cl.
CPC .............. *F01N 5/025* (2013.01); *H01L 35/30* (2013.01); *H01L 35/32* (2013.01); *F01N 2240/02* (2013.01); *F01N 2410/00* (2013.01); *Y02E 20/14* (2013.01); *Y02T 10/16* (2013.01)

(58) Field of Classification Search
USPC ......... 60/274, 275, 287, 288, 289, 292, 293, 60/298, 320, 321, 324
See application file for complete search history.

(56) References Cited

U.S. PATENT DOCUMENTS

| 8,443,594 | B2* | 5/2013 | Prior | F01N 5/025 136/201 |
| 9,074,506 | B2* | 7/2015 | An | F01N 5/025 |
| 9,140,168 | B2* | 9/2015 | Reynolds | F01N 5/02 |
| 9,664,087 | B2* | 5/2017 | Sloss | F01N 5/02 |
| 9,831,410 | B2* | 11/2017 | Rinaldi | H01L 35/30 |

FOREIGN PATENT DOCUMENTS

JP 2016109018 * 6/2016 .............. F01N 5/02

* cited by examiner

*Primary Examiner* — Binh Q Tran
(74) *Attorney, Agent, or Firm* — Morgan, Lewis & Bockius LLP

(57) ABSTRACT

A thermoelectric generating apparatus may include a thermoelectric generation portion disposed on a first flow passage, and configured to convert thermal energy of exhaust gas passing through the first flow passage into electrical energy; a heat exchange portion disposed on a second flow passage, and configured to heat coolant through heat-exchange of the coolant and exhaust gas passing through the second flow passage; a third flow passage configured to pass through received exhaust gas without change; and a valve configured to selectively open or close the first flow passage, the second flow passage, or the third flow passage, and thus control a flowing route of the exhaust gas.

16 Claims, 9 Drawing Sheets

THERMOELECTRIC GENERATING APPARATUS OF VEHICLE AND METHOD FOR CONTROLLING THE SAME

CROSS-REFERENCE(S) TO RELATED APPLICATIONS

The present application claims priority to Korean Patent Application No. 10-2016-0181837, filed on Dec. 29, 2016, the entire contents of which is incorporated herein for all purposes by this reference.

BACKGROUND OF THE INVENTION

Field of the Invention

The present invention relates to a vehicle, and more particularly, to a thermoelectric generating apparatus for the vehicle.

Description of Related Art

A thermoelectric generating apparatus is a device for obtaining electrical energy using a difference in potential between a heating element and a cooling element, wherein the thermoelectric generating apparatus can directly generate electrical energy through a heat source without using a mechanical operation.

The thermoelectric generating apparatus has been widely used in other technical fields other than vehicle technology. For example, the thermoelectric generating apparatus has been used in power generation facilities for secluded place (s), such as a space probe (Voyager II), etc. In recent times, various methods for applying the thermoelectric generating apparatus to various technical fields, for example, a garbage incinerator, based cogeneration geothermal power generation, gradient power generation, etc. have been intensively researched and discussed.

Meanwhile, considering the flow of energy in vehicles, the chemical energy of gasoline burned by a vehicle engine is converted into mechanical energy. In the present case, thermal efficiency is merely approximately 30%, and the remaining energy is emitted as heat, vibration, sound, etc.

Therefore, the recycling of emission energy is needed for improvement in fuel efficiency. Since a higher-temperature thermal energy from among emission thermal energies has a higher energy efficiency, many developers and companies are conducting intensive research into various methods for using the exhaust heat of the engine having a high-temperature region having several hundreds of degrees as a high-temperature heat source, or generating electrical energy through thermoelectric generation.

The information disclosed in this Background of the Invention section is only for enhancement of understanding of the general background of the invention and should not be taken as an acknowledgment or any form of suggestion that this information forms the prior art already known to a person skilled in the art.

BRIEF SUMMARY

Various aspects of the present invention are directed to providing a thermoelectric generating apparatus for a vehicle configured to variably control a flow passage of exhaust gas according to not only a heat-amount condition of the exhaust gas flowing into the thermoelectric generating apparatus, but also a temperature of engine coolant, wherein maximum efficiency of a thermoelectric generating system for each vehicle traveling condition can be acquired, and a method for controlling the thermoelectric generating apparatus.

Additional aspects of the invention will be set forth in part in the description which follows and, in part, will be obvious from the description, or may be learned by practice of the invention.

In accordance with an aspect of the present invention, a thermoelectrical generating apparatus may include a thermoelectric generation portion disposed on a first flow passage and configured to convert the thermal energy of exhaust gas passing through the first flow passage into electrical energy; a heat exchange portion disposed on a second flow passage and configured to heat coolant through heat-exchange of the coolant and the exhaust gas passing through the second flow passage; a third flow passage configured to pass through received exhaust gas without change; and a valve configured to selectively open or close the first flow passage, the second flow passage, or the third flow passage, and thus control a flowing route of the exhaust gas.

The thermoelectric generating apparatus may further include: a controller configured to variably control opening and closing of the first flow passage, the second flow passage, and the third flow passage by controlling the valve according to a temperature of the exhaust gas and a temperature of the coolant.

When the temperature of the coolant is less than a coolant reference temperature, the controller may open the first flow passage and the second flow passage and may close the third flow passage such that the exhaust gas only flows through the thermoelectric generation portion and the heat exchange portion.

When the coolant temperature is equal to or higher than the coolant reference temperature and the exhaust gas temperature is less than the exhaust gas reference temperature, the controller may partially open the first flow passage and may close the second flow passage and the third flow passage such that the exhaust gas flows through only some parts of the thermoelectric generation portion.

When the coolant temperature is equal to or higher than the coolant reference temperature and the exhaust gas temperature is equal to or higher than the exhaust gas reference temperature, the controller may fully open the first flow passage and may close the second flow passage and the third flow passage such that the exhaust gas flows through the entirety of the thermoelectric generation portion.

When the coolant temperature is equal to or higher than a coolant overheat temperature and the exhaust gas temperature is equal to or higher than an exhaust gas overheat reference temperature, the controller may open the third flow passage and may close the first flow passage and the second flow passage such that the exhaust gas is discharged through only the third flow passage.

The thermoelectric generation portion and the heat exchange portion may be integrated to form a thermoelectric generation module, and the thermoelectric generation module may be included in a housing.

The third flow passage may be formed in a remaining area other than the disposition area of the thermoelectric generation module within the housing.

In accordance with another aspect of the present invention, a method for controlling a thermoelectric generating apparatus which includes a thermoelectric generation portion disposed on a first flow passage, and configured to convert thermal energy of exhaust gas passing through the first flow passage into electrical energy; a heat exchange portion disposed on a second flow passage, and configured to heat coolant through heat-exchange of the coolant and exhaust gas passing through the second flow passage; a third flow passage configured to pass through received exhaust gas without change; and a valve configured to selectively open or close the first flow passage, the second flow passage, or the third flow passage, and thus control a flowing route of the exhaust gas; the method may include receiving a temperature of the exhaust gas and a temperature of the coolant; and controlling the valve according to the exhaust gas temperature and the coolant temperature, and thus variably controlling opening and closing of the first flow passage, the second flow passage, and the third flow passage.

The controlling of the valve may further include: when the temperature of the coolant is less than a coolant reference temperature, opening the first flow passage and the second flow passage and closing the third flow passage such that the exhaust gas flows through only the thermoelectric generation portion and the heat exchange portion.

The controlling of the valve may further include: when the coolant temperature is equal to or higher than the coolant reference temperature and the exhaust gas temperature is less than the exhaust gas reference temperature, partially opening the first flow passage and closing the second flow passage and the third flow passage such that the exhaust gas flows through only some parts of the thermoelectric generation portion.

The controlling of the valve may further include: when the coolant temperature is equal to or higher than the coolant reference temperature and the exhaust gas temperature is equal to or higher than the exhaust gas reference temperature, fully opening the first flow passage and closing the second flow passage and the third flow passage such that the exhaust gas flows through the entirety of the thermoelectric generation portion.

The controlling of the valve may include: when the coolant temperature is equal to or higher than a coolant overheat temperature and the exhaust gas temperature is equal to or higher than an exhaust gas overheat reference temperature, opening the third flow passage and closing the first flow passage and the second flow passage such that the exhaust gas is discharged through only the third flow passage.

The thermoelectric generation portion and the heat exchange portion may be integrated to form a thermoelectric generation module, and the thermoelectric generation module may be included in a housing.

The third flow passage may be formed in a remaining area other than disposition area of the thermoelectric generation module within the housing.

In accordance with another aspect of the present invention, a thermoelectric generating apparatus may include a thermoelectric generation portion disposed on a first flow passage, and configured to convert thermal energy of exhaust gas passing through the first flow passage into electrical energy; a heat exchange portion disposed on a second flow passage, and configured to heat coolant through heat-exchange of the coolant and exhaust gas passing through the second flow passage; and a valve configured to selectively open or close the first flow passage, the second flow passage, or the third flow passage, and thus control a flowing route of the exhaust gas.

In accordance with another aspect of the present invention, a thermoelectric generating apparatus may include a thermoelectric generation portion disposed on a first flow passage, and configured to convert thermal energy of exhaust gas passing through the first flow passage into electrical energy; a heat exchange portion disposed on a second flow passage, and configured to heat coolant through heat-exchange of the coolant and exhaust gas passing through the second flow passage; a third flow passage through which received exhaust passes without change; a valve configured to selectively open or close the first flow passage, the second flow passage, or the third flow passage, and thus control a flowing route of the exhaust gas; and a housing configured to include the thermoelectric generation portion, the heat exchange portion, and the valve, wherein the third flow passage is formed in a remaining area other than disposition area of the thermoelectric generation portion and the heat exchange portion within the housing.

In accordance with another aspect of the present invention, a thermoelectric generating apparatus of a vehicle may include a thermoelectric generation portion disposed on a first flow passage, and configured to convert thermal energy of exhaust gas passing through the first flow passage into electrical energy; a heat exchange portion disposed on a second flow passage, and configured to heat coolant through heat-exchange of the coolant and exhaust gas passing through the second flow passage; a third flow passage through which received exhaust passes without change; a valve configured to selectively open or close the first flow passage, the second flow passage, or the third flow passage, and thus control a flowing route of the exhaust gas; and a controller configured to variably control opening or closing of the first flow passage, the second flow passage, and the third flow passage by controlling the valve according to the exhaust gas temperature and the coolant temperature.

The methods and apparatuses of the present invention have other features and advantages which will be apparent from or are set forth in more detail in the accompanying drawings, which are incorporated herein, and the following Detailed Description, which together serve to explain certain principles of the present invention.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Reference will now be made in detail to various embodiments of the present invention(s), examples of which are illustrated in the accompanying drawings and described below. While the invention(s) will be described in conjunction with exemplary embodiments, it will be understood that the present description is not intended to limit the invention(s) to those exemplary embodiments. On the contrary, the invention(s) is intended to cover not only the exemplary embodiments, but also various alternatives, modifications, equivalents and other embodiments, which may be included within the spirit and scope of the invention as defined by the appended Claims.

Figure 1:
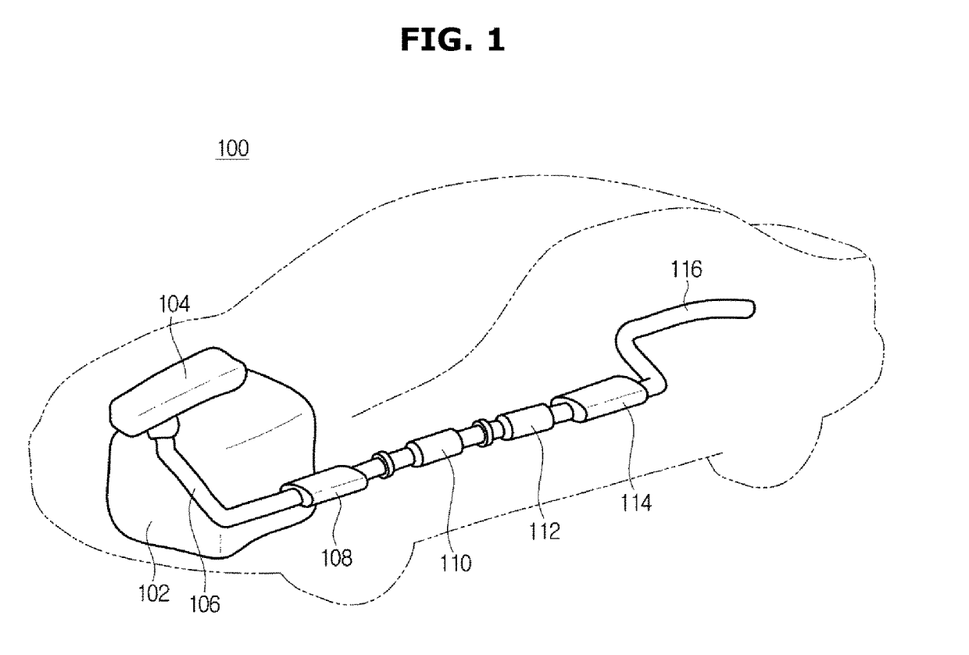
FIG. 1 is a view illustrating a vehicle according to an exemplary embodiment of the present invention.

FIG. 1 is a view illustrating a vehicle 100 according to an exemplary embodiment of the present invention. FIG. 1 illustrates an exhaust device configured to easily discharge exhaust gas generated by the engine 102 of the vehicle 100 to the outside of the vehicle 100. The exhaust device may discharge exhaust gas generated when a fuel is burned in the engine 103 to the outside of the vehicle 100. In addition, the exhaust device may remove noxious gas contained in the exhaust gas in a process of discharging the exhaust gas. In addition, volume and tone of exhaust sound generated in the discharging of the exhaust gas may also be controlled.

The process for discharging exhaust gas generated from the engine 102 can be summarized as follows. The exhaust gas discharged from the engine 102 flows into an exhaust manifold 104 through an exhaust port of a cylindrical head of the engine 102, and is then collected in the discharge pipe 106. Thereafter, the collected exhaust gas sequentially passes through a catalytic converter 108 configured for purifying and removing noxious gas, a resonator 112 configured for adjusting volume and tone of the exhaust sound, and a muffler 114, and is finally discharged to the outside through a tail pipe 116.

The exhaust manifold 104 is formed by collecting exhaust pipes connected to the respective cylinders contained in the engine 102, and prevents occurrence of interference by controlling air exhaust between the respective cylinders to maintain suitable back pressure. The catalytic converter 108 is configured to purify the exhaust gas, and may include a manifold catalyzer disposed near the exhaust manifold 104 and an underfloor catalyzer disposed below a floor. The resonator 112 and the muffler 114 may reduce a temperature and pressure of the exhaust gas, and may adjust volume and tone of the exhaust sound.

In FIG. 1, a thermoelectric generating apparatus 110 according to the embodiment may be disposed between the catalytic converter 108 and the resonator 112. The mounting position of the thermoelectric generating apparatus 110 is not limited only to the section between the catalytic converter 108 and the resonator 112, and may be set to any position of the exhaust device without departing from the scope or spirit of the present invention. The thermoelectric generating apparatus 110 may generate power by converting thermal energy of the exhaust gas into electrical energy. The power generated from the thermoelectric generating apparatus 110 may charge the battery or may be directly transferred to electronic components.

The structure of the thermoelectric generating apparatus 110 of the vehicle 100 according to the exemplary embodiment of the present invention will hereinafter be described with reference to FIG. 2, FIG. 3 and to FIG. 4.

Figure 2:
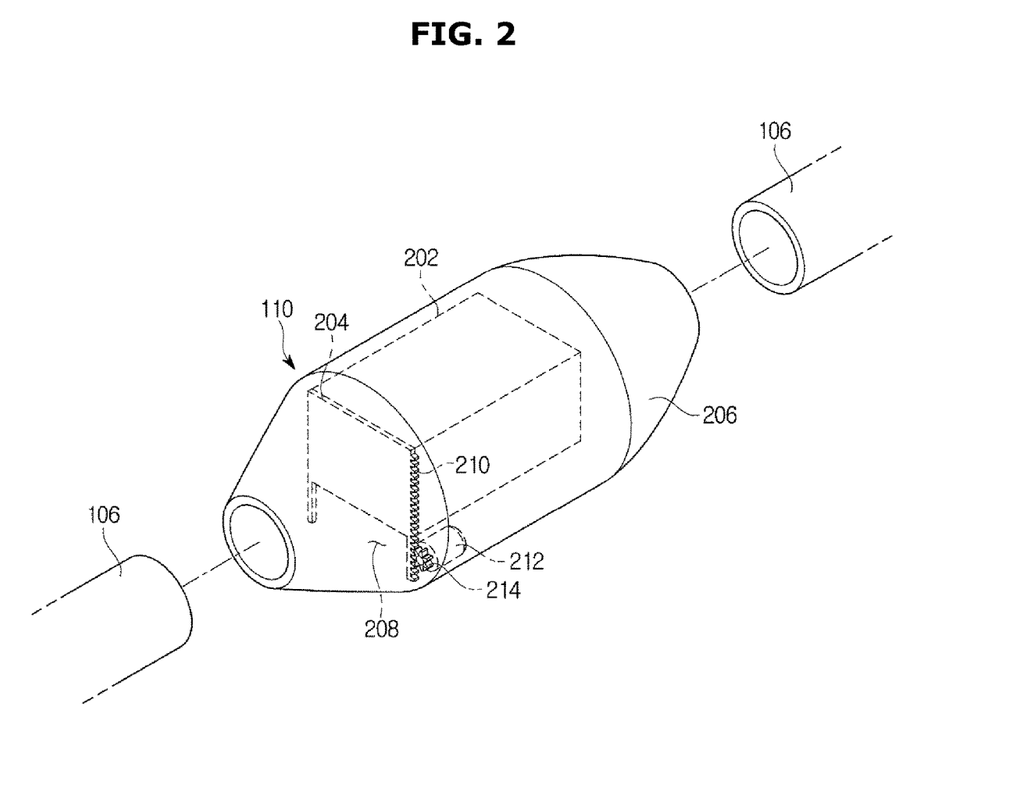
FIG. 2 is a view illustrating a thermoelectric generating apparatus of the vehicle according to an exemplary embodiment of the present invention.

FIG. 2 is a view illustrating a thermoelectric generating apparatus of the vehicle according to an exemplary embodiment of the present invention. Referring to FIG. 2, the thermoelectric generating apparatus 110 according to the embodiment may be mounted to an exhaust flow passage between the catalytic converter 108 and the resonator 112. Since the exhaust pipe 106 is connected to both end portions of a housing 206, exhaust gas flowing from one side to the other side of the exhaust pipe 106 may pass through the thermoelectric generation module 202 or the bypass passage 208. In FIG. 2, a valve 204 may adjust flow of the exhaust gas passing through the thermoelectric generation module 202 and the bypass passage 208. That is, the valve 204 may fully open or partially open one surface of the thermoelectric generation module 202, wherein the valve 204 may control flow of the exhaust gas passing through the thermoelectric generation module 202. In addition, the bypass passage 208 formed below the thermoelectric generation module 202 is opened or closed in the housing 206, and flow of the exhaust gas may be controlled by the bypass passage 208.

In FIG. 2, one surface of the thermoelectric generation module 202 may be fully or partially opened or closed. The opening and closing operation of the valve may be performed by raising or lowering the valve 204 at one end portion of the thermoelectric generation module 202. That is, the valve 204 may be raised or lowered in the direction parallel to the surface of one end portion of the thermoelectric generation module 202, wherein the entire or partial operation of the flow passage of the thermoelectric generation module 202 may be opened or closed. The flow passage of the exhaust gas flowing into the thermoelectric generating apparatus 110 may be formed by opening or closing the valve 204. That is, the flowing exhaust gas may flow only through the flow passage opened by the valve 204, and may not flow into the other flow passage closed by the valve 204.

Teeth 210 may be formed at one side surface of the valve 204. A gear 214 engaged with the teeth 210 may be rotated by a motor 212. That is, rotational force of the motor 212 may rotate the gear 214, and the valve 204 may perform rectilinear movement by rotational movement of the gear 214, wherein raising or lowering of the valve 204 may be performed. When raising of the valve 204 is performed during forward rotation of the motor 212, then lowering of the valve 204 may be performed during backward rotation of the motor 212.

The bypass passage 208 may be formed in the portion below the thermoelectric generation module 202. The bypass passage 208 may allow the exhaust gas to pass through the thermoelectric generating apparatus 110 without passing through the thermoelectric generation module 202, wherein the exhaust gas is discharged from the thermoelectric generating apparatus 110. The exhaust gas passing through the bypass passage 208 may not affect thermoelectric generation and heat exchange. The opening or closing operation of the bypass passage 208 may also be performed by raising or lowering of the bypass passage 208. In other words, when the valve 204 sufficiently ascends, the bypass passage 208 may be opened. In contrast, when the valve 204 sufficiently descends, the bypass passage 208 may be closed by the valve 204.

Figure 3:
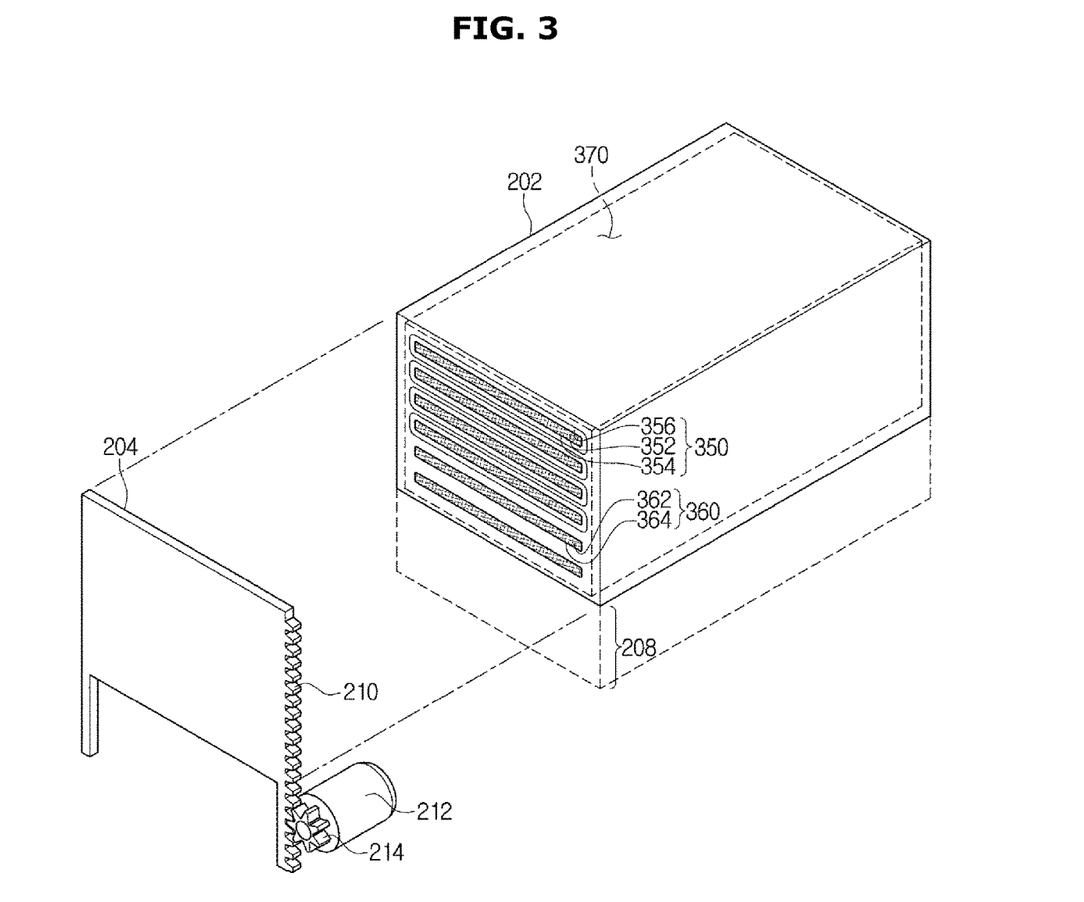
FIG. 3 is a structural view illustrating a thermoelectric generation module of a thermoelectric generating apparatus according to an exemplary embodiment of the present invention.

FIG. 3 is a structural view illustrating a thermoelectric generation module of a thermoelectric generating apparatus according to an exemplary embodiment of the present invention. In FIG. 3, the exhaust gas flowing into the thermoelectric generating apparatus 110 may pass through at least one of three flow passages, i.e., a flow passage passing through a thermoelectric generation portion 350 of the thermoelectric generation module 202, a flow passage passing through a heat exchange portion 360, and a bypass passage 208 formed below the thermoelectric generation module 202.

The exhaust gas passing through the thermoelectric generation portion 350 of the thermoelectric generation module 202 may contribute to power generation after passing through the thermoelectric generation module 350. The thermoelectric generating apparatus 110 of the vehicle 100 according to the embodiment may use heat from the exhaust gas as a high-temperature heat source using the Seebeck effect, or may convert heat from the exhaust gas into electrical energy. According to the Seebeck effect, two metals or both end portions of the semiconductor are bonded so that a difference in temperature occurs in the bonded portion, resulting in the occurrence of a thermal electromotive force. A plurality of slits 352 may be formed in the thermoelectric generation portion 350 of the thermoelectric generation module 202 shown in FIG. 3, a fin structure 354 may be disposed in each slit 352. Heat from the exhaust gas passing through the slit 352 may be absorbed by the fin structure 354. A thermoelectric element 356 may enclose the external circumference of each slit 352, and the external side of the thermoelectric element 356 may be filled with coolant 370. That is, the fin structure 354, the thermoelectric element 356, and the coolant 370 are sequentially disposed wherein the thermoelectric element 356 may generate power due to a difference in temperature between the fin structure 354 and the coolant 370. That is, the fin structure 354 contained in the slit 352 is at a high temperature by absorbing heat from the exhaust gas, and the thermoelectric generating element 356 enclosing the slit 352 is cooled by coolant 370. In the present case, an electromotive force may be generated by a difference in temperature between a high-temperature fin structure 354 and a low-temperature thermoelectric element 356, resulting in the occurrence of an electromotive force and power (Seeback effect).

The exhaust gas passing through the heat exchange portion 360 of the thermoelectric generation module 202 passes through the heat exchange portion 360, wherein coolant can be heated by heat exchange. A plurality of slits 362 may be formed in the heat exchange portion 360 of the thermoelectric generation module 202 shown in FIG. 3, and the fin structure 364 may be disposed in the slits 362. Heat from the exhaust gas passing through the inside of the slit 362 may be absorbed by the fin structure 364. Differently from the thermoelectric generation portion 350, the circumference of the slits 362 of the heat exchange portion 360 may directly contact the coolant 370. Therefore, the coolant 370 may be heated by direct heat exchange between the high-temperature fin structure 364, having absorbed heat from the exhaust gas, and the low-temperature coolant 370.

Figure 4:
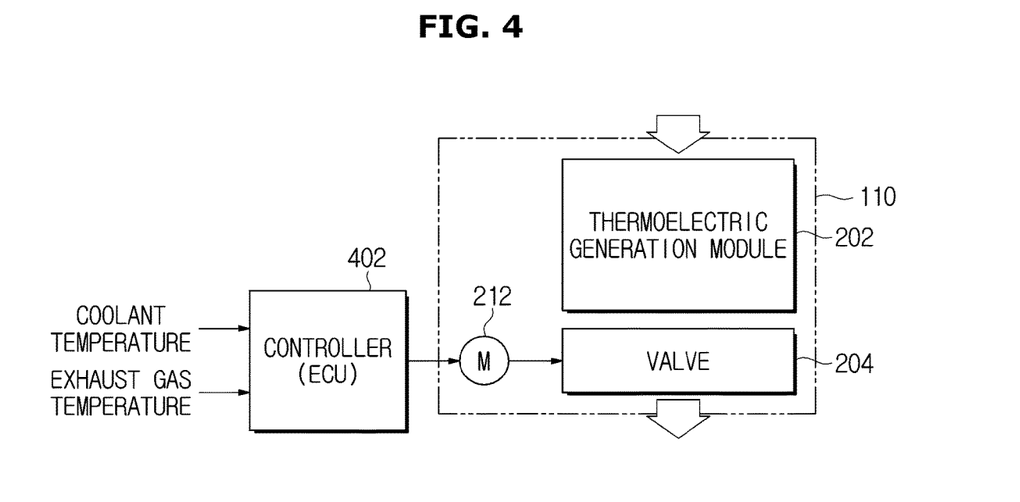
FIG. 4 is a conceptual diagram illustrating a control system of the thermoelectric generating apparatus according to an exemplary embodiment of the present invention.

FIG. 4 is a conceptual diagram illustrating a control system of the thermoelectric generating apparatus according to an exemplary embodiment of the present invention. A controller 402 may be an electronic control unit (ECU) for controlling the overall operation of the thermoelectric generating apparatus 110. The controller 402 may be one of constituent elements of the thermoelectric generating apparatus 110. Alternatively, the controller 402 may be an external ECU separated from the thermoelectric generating apparatus 110. The controller 402 may receive information regarding a temperature of the coolant and information regarding a temperature of the exhaust gas, and may generate a control signal for driving the valve 204 on the basis of the received coolant temperature and the exhaust gas temperature. That is, the controller 402 may control the rotation direction and the number of rotations of the motor 212 by generating a control signal, wherein the moving direction and the moving distance of the valve 204 can be adjusted. By adjustment between the moving direction and the moving distance of the valve 204, a flow passage of the exhaust gas may be determined in the thermoelectric generating apparatus 110.

A method for controlling the thermoelectric generating apparatus 110 of the vehicle 100 and the opening and closing operation of the valve 204 will hereinafter be described with reference to FIG. 5 to FIG. 9.

Figure 5:
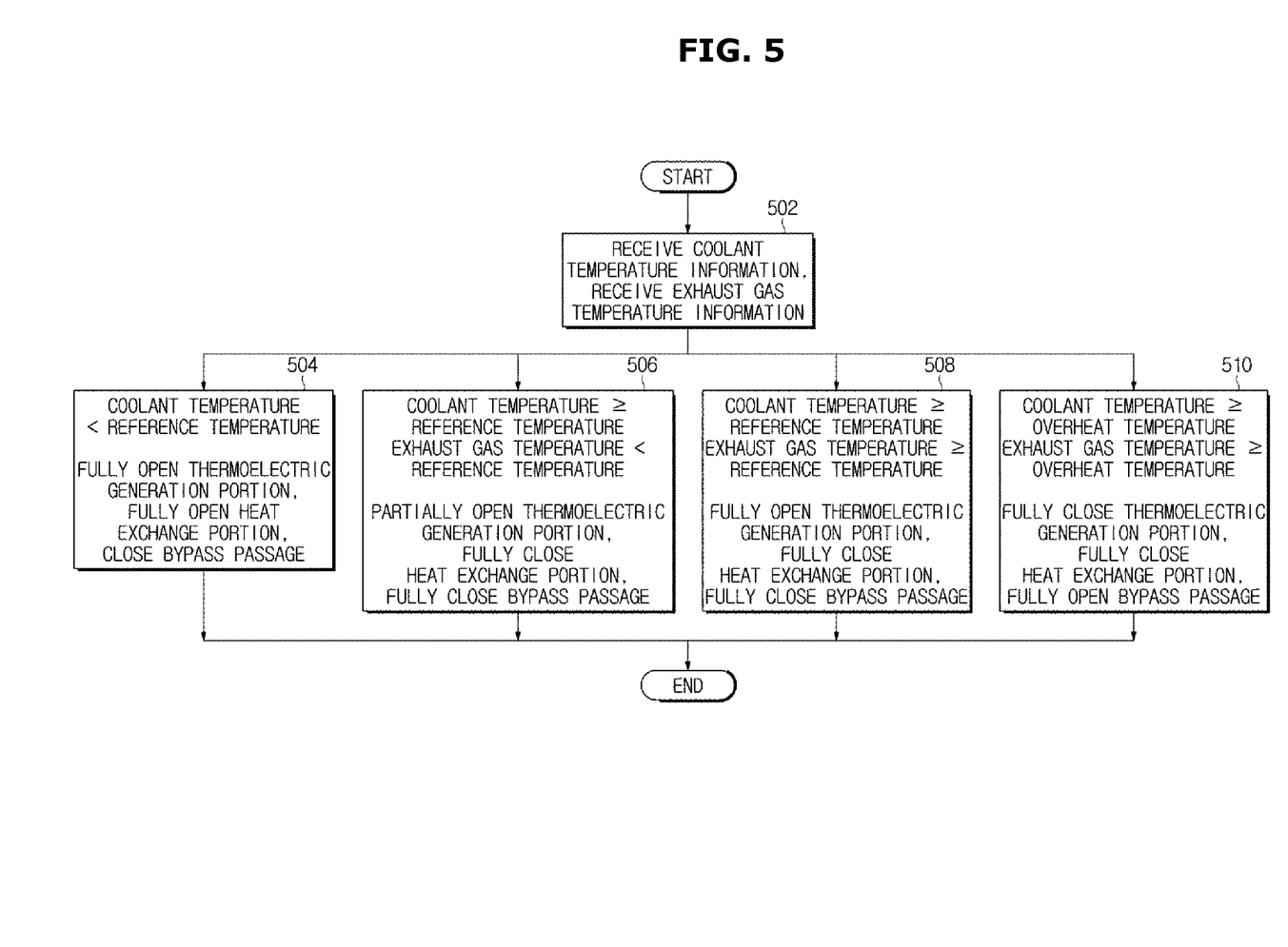
FIG. 5 is a flowchart illustrating a method for controlling a thermoelectric generating apparatus of a vehicle according to an exemplary embodiment of the present invention.

FIG. 5 is a flowchart illustrating a method for controlling the thermoelectric generating apparatus of the vehicle according to an exemplary embodiment of the present invention. Referring to FIG. 5, the controller 402 may generate a control signal for properly adjusting a flow passage of the exhaust gas on the basis of the coolant temperature information and the exhaust gas temperature information, wherein thermoelectric generation control and heat exchange control may be efficiently carried out according to the exhaust gas temperature and the coolant temperature. That is, the controller 204 may control the opening and closing degree of the thermoelectric generation portion 350, the heat exchange portion 360, and the bypass passage 208 by adjusting the moving direction and the moving distance of the valve 204 according to the coolant temperature and the exhaust gas temperature, wherein the flow passage of the exhaust gas is controlled.

For the present purpose, the controller 204 may compare the coolant temperature and the exhaust gas temperature with different reference temperatures, respectively. The reference temperature of the coolant and the reference temperature of the exhaust gas may be different from each other. The reference temperature of the coolant may be a temperature related to vehicle warm-up and the reference temperature of the exhaust gas may be a reference temperature value for discriminating between a temperature having sufficient thermoelectric generating efficiency or sufficient heat exchange efficiency, and the other temperature having insufficient thermoelectric generating efficiency or insufficient heat exchange efficiency. That is, when the coolant has a temperature less than the reference temperature, this signifies that vehicle warm-up is needed. When the exhaust gas temperature is less than the reference temperature, this signifies that electric generating efficiency or heat exchange efficiency is relatively low. In contrast, when the exhaust gas temperature is equal to or higher than the reference temperature, this signifies that electric generating efficiency or heat exchange efficiency is relatively high.

In addition, the controller 402 may compare the coolant temperature and the exhaust gas temperature with different overheat temperatures, respectively. The overheat temperature of the coolant and the overheat temperature of the exhaust gas may be different from each other. The coolant overheat temperature and the exhaust gas overheat temperature may be a reference temperature value that is higher than a temperature having sufficient thermoelectric generating efficiency or sufficient heat exchange efficiency to determine whether or not a possibility of danger caused by such overheating is predicted. That is, assuming that the coolant temperature and the exhaust gas temperature are equal to or higher than the respective overheat temperatures, this signifies that a high possibility of danger caused by overheating is predicted.

In FIG. 5, the controller 402 may receive the coolant temperature information and the exhaust gas temperature information (Operation 502). The controller 402 may receive the coolant temperature information and the exhaust gas temperature information, may compare the received information with a reference temperature or an overheat temperature, and may variably control the valve 204 according to a current coolant temperature and a current exhaust gas temperature as denoted by reference numbers 504 to 510.

Figure 6:
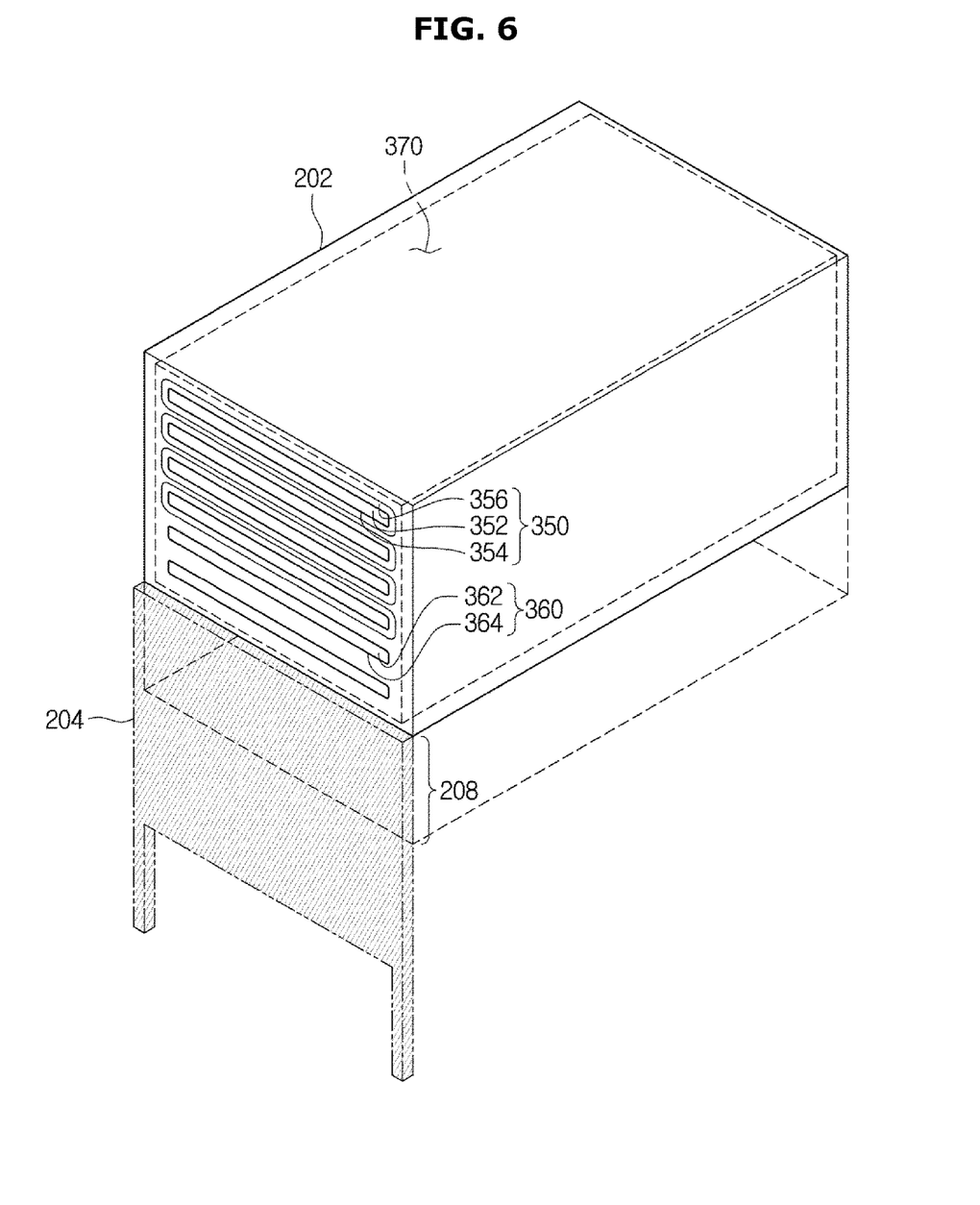
FIG. 6 is a view illustrating a valve state when a coolant temperature is less than a reference temperature.

In Operation 504 of FIG. 5, assuming that the coolant temperature is less than the reference temperature, the controller 402 may control the valve 204 to fully open the thermoelectric generation portion 350 and the heat exchange portion 360, and may close the bypass passage 208 (Operation 504). States of the valve 204 are shown in FIG. 6. FIG. 6 illustrates states of the valve 204 when the coolant temperature is low. As illustrated in FIG. 6, the thermoelectric generation portion 350 and the heat exchange portion 360 may be fully opened, and the bypass passage 208 may be closed.

In Operation 504 of FIG. 5, when the coolant temperature is less than the reference temperature (a low temperature), this signifies that the engine 102 is in a warm-up stage after engine ignition. In the present case, the controller 402 may determine that sufficient electric generation efficiency and sufficient heat exchange efficiency are not expected due to a low temperature of the coolant and a low temperature of the exhaust gas, wherein the thermoelectric generation portion 350 and the heat exchange portion 360 are opened and the bypass passage 208 is closed. As a result, the exhaust gas may be concentrated on the thermoelectric generation portion 350 and the heat exchange portion 360, and may not pass through the bypass passage 208. In the present case, the exhaust gas passes through the thermoelectric generation portion 350 and the heat exchange portion 360. Since the exhaust gas is at a relatively low temperature, it is difficult to expect the sufficient thermoelectric generating efficiency, and the coolant can be more quickly heated when the exhaust gas passes through the heat exchange portion 360.

In the warm-up stage of the engine 102, when the coolant is rapidly heated, the warm-up time of the engine 102 can be reduced, and a passenger compartment (boarding compartment) of the vehicle can be rapidly heated. In addition, the thermoelectric generating apparatus can more rapidly cope with a situation in which thermal energy having a relatively high temperature is needed.

Figure 7:
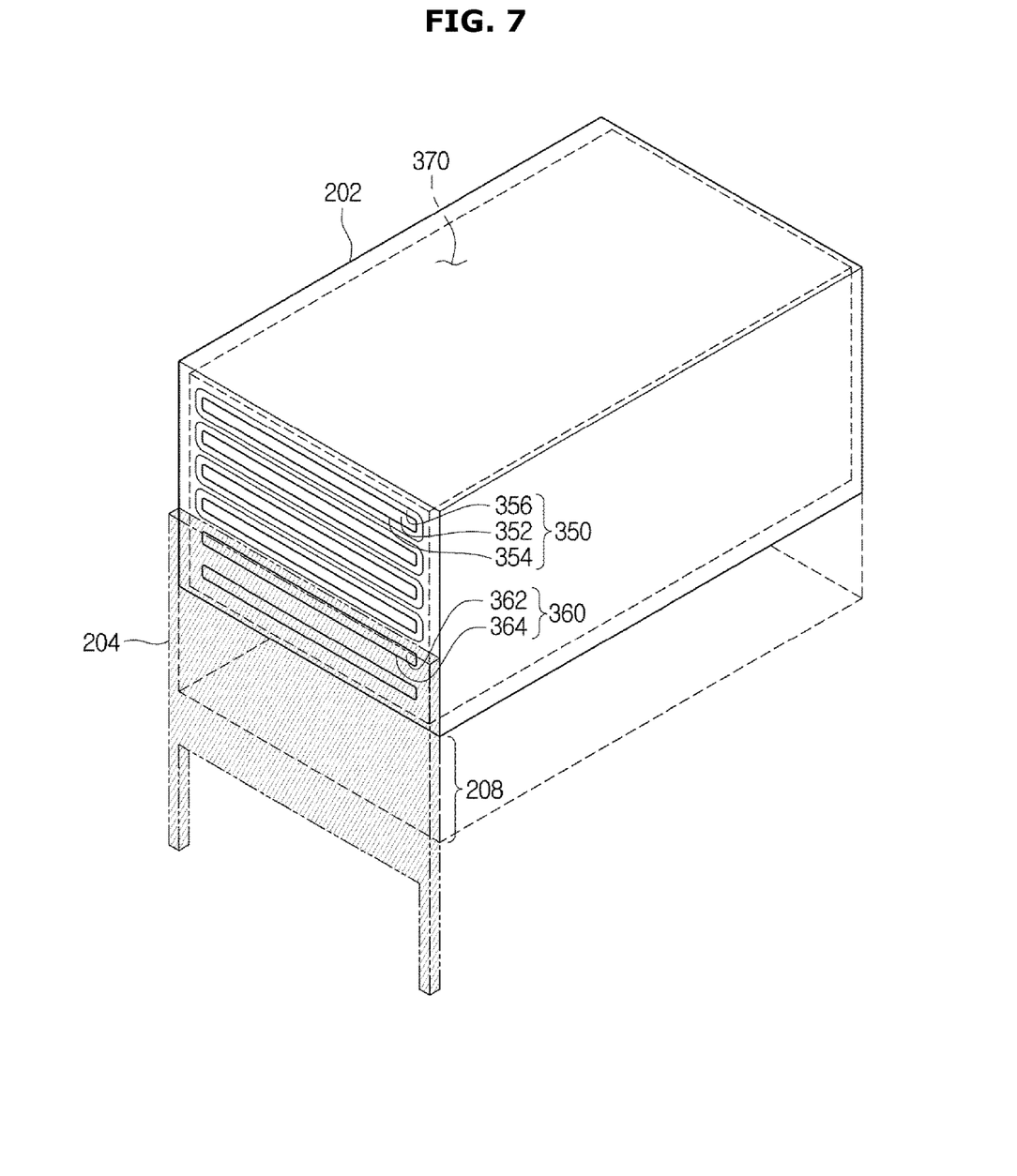
FIG. 7 is a view illustrating a valve state not only when a coolant temperature is equal to or higher than a reference temperature but also when a temperature of exhaust gas is less than a reference temperature.

In Operation 506 of FIG. 5, when the coolant temperature is equal to or higher than a reference temperature (i.e., when the coolant temperature is high) and when the exhaust gas temperature is less than a reference temperature (i.e., when the exhaust gas temperature is low), the controller 402 may open only some parts of the thermoelectric generation portion 350, and the remaining portion of the thermoelectric generation portion 350, the entirety of the heat exchange portion 360, and the entirety of the bypass passage 208 may be closed (Operation 506). States of the valve 204 are shown in FIG. 7. FIG. 7 illustrates the states of the valve 204 when the coolant temperature is equal to or higher than a reference temperature and when the exhaust gas temperature is less than a reference temperature. As illustrated in FIG. 7, only some parts of the thermoelectric generation portion 350 may be opened, and the remaining portion of the thermoelectric generation portion 350, the entirety of the heat exchange portion 360, and the entirety of the bypass passage 208 may be closed.

In Operation 506 of FIG. 5, when the coolant temperature is equal to or higher than a reference temperature (i.e., when the coolant temperature is high), and when the exhaust gas temperature is less than a reference temperature (i.e., when the exhaust gas temperature is low), this signifies that the engine 102 is being driven at a relatively low RPM. That is, this signifies that the vehicle 100 is being driven at a low speed. In the present case, the exhaust gas temperature is relatively low whereas the coolant temperature is high, wherein the amount of heat supplied from the exhaust gas is low. As a result, the controller 402 may open only some parts of the thermoelectric generation portion 350, and the remaining part of the thermoelectric generation portion 350, the entirety of the heat exchange portion 360, and the entirety of the bypass passage 208 may be closed, wherein the exhaust gas is concentrated only in some parts of the thermoelectric generation portion 350 through which the exhaust gas passes, resulting in power generation. By control of the above-mentioned valve 204, even in the case in which the coolant temperature is higher than or equal to the reference temperature (the coolant temperature is high) and the exhaust gas temperature is less than a reference temperature (the exhaust gas temperature is low), the controller 402 may control some parts of the thermoelectric generation portion 350 to generate electrical energy (power), resulting in increased power generation efficiency.

Figure 8:
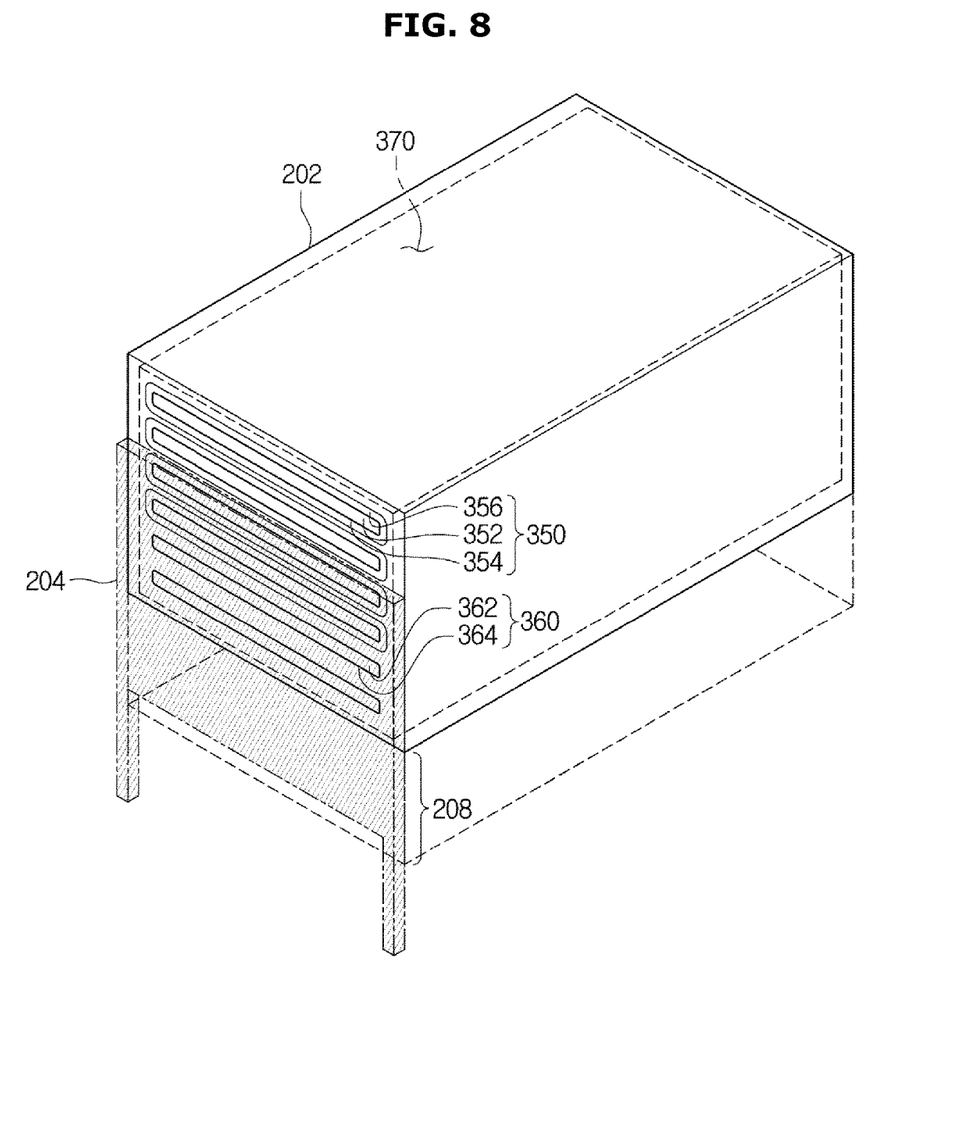
FIG. 8 is a view illustrating a valve state not only when a coolant temperature is equal to or higher than a reference temperature but also when a temperature of exhaust gas is equal to or higher than a reference temperature.

In Operation 508 of FIG. 5, when the coolant temperature is equal to or higher than a reference temperature (when the coolant temperature is high) and when the exhaust gas temperature is also equal to or higher than the reference temperature (when the exhaust gas temperature is high), the controller 402 may control the valve 204 to open the entirety of the thermoelectric generation portion 350, and may close the entirety of the heat exchange portion 360 and the entirety of the bypass passage 208 (Operation 508). The states of the valve 204 are shown in FIG. 8. FIG. 8 illustrates the states of the valve 204 when the coolant temperature is equal to or higher than a reference temperature and when the exhaust gas temperature is equal to or higher than a reference temperature. As illustrated in FIG. 8, only some parts of the thermoelectric generation portion 350 may be opened, and the remaining portion of the thermoelectric generation portion 350, the entirety of the heat exchange portion 360, and the entirety of the bypass passage 208 may be closed.

In Operation 508 of FIG. 5, when the coolant temperature is equal to or higher than a reference temperature (i.e., when the coolant temperature is high), and when the exhaust gas temperature is equal to or higher than a reference temperature (i.e., when the exhaust gas temperature is high), this signifies that the engine state 102 is being driven at a relatively low RPM. That is, this signifies that the vehicle 100 is being driven at a low speed. In the present case, the controller 402 may determine that the coolant temperature is high and the exhaust gas temperature is high wherein the amount of heat supplied is considered sufficient, wherein the controller 402 may open the entirety of the thermoelectric generation portion 350 and may close the entirety of the heat exchange portion 360 and the entirety of the bypass passage 208, wherein the exhaust gas may be concentrated in the entirety of the thermoelectric generation portion 350 and may not pass through the heat exchange portion 360 and the bypass passage 208. By control of the above-mentioned valve 204, when the exhaust gas temperature is sufficiently high and the amount of heat supplied from the exhaust gas is considered sufficient, the exhaust gas is concentrated only in the thermoelectric generation portion 350, wherein maximum power may be generated from the thermoelectric generation portion 350.

Figure 9:
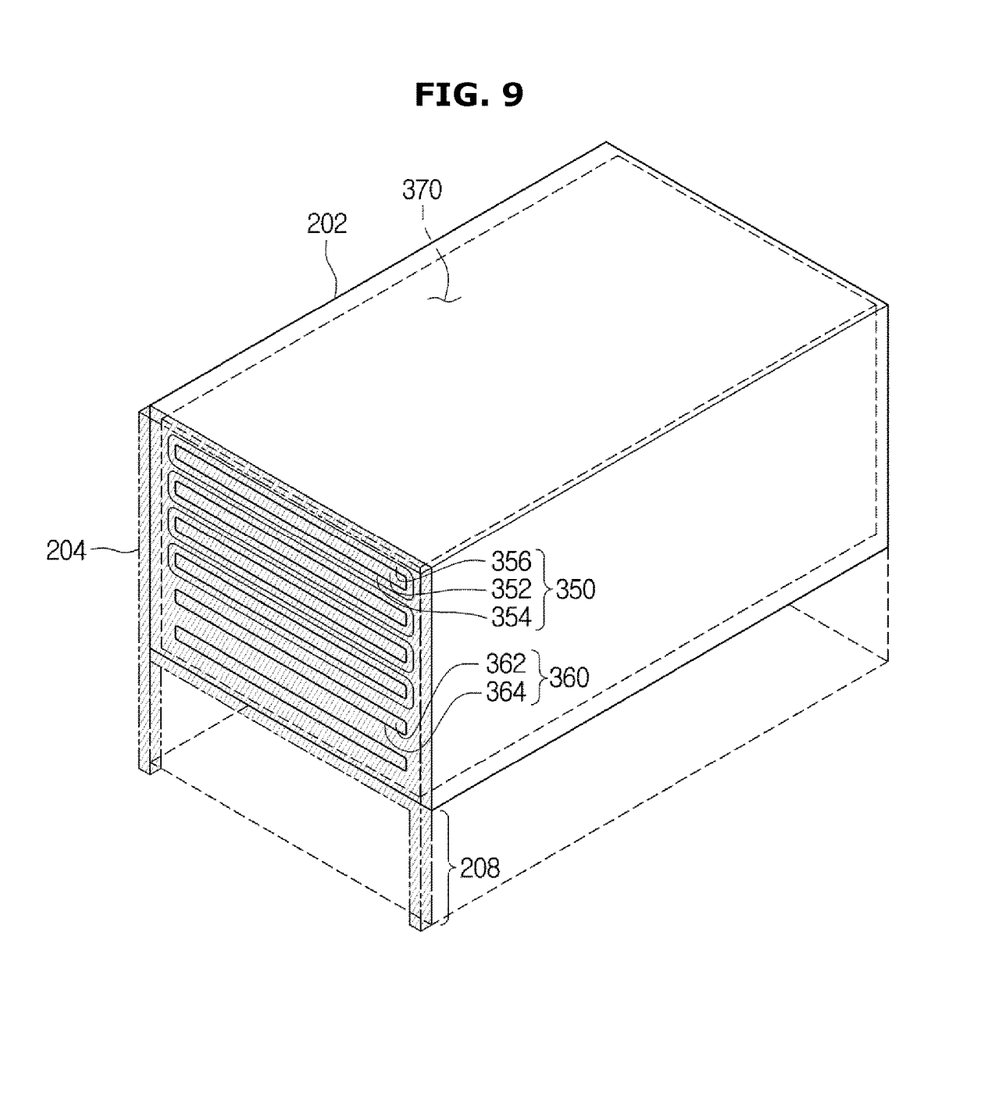
FIG. 9 is a view illustrating a valve state not only when a coolant temperature is equal to or higher than an overheat temperature but also when a temperature of exhaust gas is equal to or higher than an overheat temperature.

In Operation 510 of FIG. 5, when the coolant temperature is equal to or higher than an overheat temperature and when the exhaust gas temperature is also equal to or higher than an overheat temperature, the controller 402 may close the entirety of the thermoelectric generation portion 350 and the entirety of the thermoelectric generation portion 360 by controlling the valve 204, and may open only the bypass passage 208 (Operation 510). The states of the valve 204 are shown in FIG. 9. FIG. 9 illustrates the states of the valve 204 when the coolant temperature is equal to or higher than an overheat temperature and when the exhaust gas temperature is equal to or higher than an overheat temperature. As illustrated in FIG. 9, the entirety of the thermoelectric generation portion 350 and the entirety of the heat exchange portion 360 may be closed, and the entirety of the bypass passage 208 may be opened.

In Operation 510 of FIG. 5, when the coolant temperature is equal to or higher than a coolant overheat temperature (i.e., the coolant is overheated) and when the exhaust gas temperature is also equal to or higher than an exhaust gas overheat temperature (i.e., the exhaust gas is overheated), it is expected that there is a high possibility that the engine 102 is overheated. In the present case, under the condition that the controller 402 discards thermoelectric generation and heat exchange and closes the entirety of the thermoelectric generation portion 350 and the heat exchange portion 360, the controller 402 opens only the bypass passage 208, wherein the exhaust gas may pass through only the bypass passage 208 without passing through the thermoelectric generation portion 350 and the heat exchange portion 360. Therefore, thermoelectric generation is not achieved by the thermoelectric generation portion 350 and heat exchange is not achieved by the heat exchange portion 360, wherein the above-mentioned result may not affect increase of the coolant temperature. However, high-temperature exhaust gas is rapidly discharged to the outside through only the bypass passage 208, wherein overheating of the engine 102 can be prevented.

Likewise, the thermoelectric generating apparatus 110 of the vehicle 100 according to the embodiment may generate power using the heat of the exhaust gas, wherein a deviation in power generated from the thermoelectric generating apparatus 110 for each state of the engine 102 can be minimized. Power generated by the thermoelectric generating apparatus 110 may be used to charge the battery through a DC-DC converter, or may be directly applied to various electronic components of the vehicle 100. The DC-DC converter may also generate a direct current (DC) output by rectifying DC input. Assuming that DC power (e.g., DC power generated by the thermoelectric generation module 110) applied to the DC-DC converter is unstable and there is a large deviation in the amount of power during each situation of the engine 102, the DC-DC converter must have various functions to cope with various situations of the engine 102, wherein the structural design of the DC-DC converter is complicated, raising the price of electronic components of the vehicle. However, as described in the exemplary embodiments of the present invention, assuming that the thermoelectric generating module 110 generates power having a minimum deviation in power during each situation of the engine, power applied to the DC-DC converter has a minimum deviation wherein the applied power can be stabilized at a predictable level. Therefore, the DC-DC converter needs to be designed in consideration of only some situations illustrated in FIG. 5, wherein the DC-DC converter structure can be simplified and production costs can also be reduced.

As is apparent from the above description, In an aspect of the present invention, a flow passage of exhaust gas is variably controlled according to a heat-amount condition of exhaust gas flowing into the thermoelectric generating apparatus and a temperature of engine coolant, wherein maximum efficiency of the thermoelectric generating system for each vehicle traveling condition can be acquired.

For convenience in explanation and accurate definition in the appended claims, the terms "upper", "lower", "up", "down", "upwards", "downwards", "inside", "outside", "internal", "outer", "inwardly", "outwardly", "internal", "external", "front", "back", "rear", "forwards", and "backwards" are used to describe features of the exemplary embodiments with reference to the positions of such features as displayed in the figures.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described to explain certain principles of the invention and their practical application, to enable others skilled in the art to make and utilize various alternatives and modifications thereof. It is intended that the scope of the invention be defined by the Claims appended hereto and their equivalents.

What is claimed is:

1. A thermoelectric generating apparatus comprising:
a thermoelectric generation portion disposed on a first flow passage, and configured to convert thermal energy of exhaust gas passing through the first flow passage into electrical energy;
a heat exchange portion disposed on a second flow passage, and configured to heat coolant through heat-exchange of the coolant and exhaust gas passing through the second flow passage;
a third flow passage configured to pass through received exhaust gas without change;
a valve configured to selectively open or close the first flow passage, the second flow passage, or the third flow passage, and thus control a flowing route of the exhaust gas; and
a controller configured to variably control opening or closing of the first flow passage, the second flow passage, and the third flow passage by controlling the valve according to a temperature of the exhaust gas and a temperature of the coolant.

2. The thermoelectric generating apparatus according to claim 1, wherein when the temperature of the coolant is less than a predetermined coolant temperature, the controller is configured to open the first flow passage and the second flow passage and is configured to close the third flow passage, and wherein the exhaust gas flows through only the thermoelectric generation portion and the heat exchange portion.

3. The thermoelectric generating apparatus according to claim 1, wherein when the coolant temperature is equal to or higher than the predetermined coolant temperature and the exhaust gas temperature is less than a predetermined exhaust gas temperature, the controller is configured to partially open the is configured to open the first flow passage and is configured to close the second flow passage and the third flow passage, and wherein the exhaust gas flows through predetermined portions of the thermoelectric generation portion.

4. The thermoelectric generating apparatus according to claim 1, wherein when the coolant temperature is equal to or higher than the predetermined coolant temperature and the exhaust gas temperature is equal to or higher than the predetermined exhaust gas temperature, the controller is configured to fully open the is configured to open the first flow passage and is configured to close the second flow passage and the third flow passage, and wherein the exhaust gas flows through an entirety of the thermoelectric generation portion.

5. The thermoelectric generating apparatus according to claim 1, wherein when the coolant temperature is equal to or higher than a coolant overheat temperature and the exhaust gas temperature is equal to or higher than a predetermined exhaust gas overheat temperature, the controller is configured to open the third flow passage and is configured to close the first flow passage and the second flow passage, and wherein the exhaust gas is discharged through the third flow passage.

6. The thermoelectric generating apparatus according to claim 1, wherein
the thermoelectric generation portion and the heat exchange portion are integrated to form a thermoelectric generation module; and
the thermoelectric generation module is disposed in a housing.

7. The thermoelectric generating apparatus according to claim 6, wherein the third flow passage is formed in a remaining area except an installation area of the thermoelectric generation module within the housing.

8. A method for controlling a thermoelectric generating apparatus which includes a thermoelectric generation portion disposed on a first flow passage, and configured to convert thermal energy of exhaust gas passing through the first flow passage into electrical energy; a heat exchange portion disposed on a second flow passage, and configured to heat coolant through heat-exchange of the coolant and exhaust gas passing through the second flow passage; a third flow passage configured to pass through received exhaust gas without change; and a valve configured to selectively open or close the first flow passage, the second flow passage, or the third flow passage, and thus control a flowing route of the exhaust gas, the method comprising:
receiving a temperature of the exhaust gas and a temperature of the coolant; and
variably controlling opening or closing of the first flow passage, the second flow passage, and the third flow passage by controlling the valve according to the exhaust gas temperature and the coolant temperature.

9. The method according to claim 8, wherein the controlling of the valve further includes:
when the temperature of the coolant is less than a predetermined coolant temperature, opening the first flow passage and the second flow passage and closing the third flow passage, and wherein the exhaust gas flows through only the thermoelectric generation portion and the heat exchange portion.

10. The method according to claim 8, wherein the controlling of the valve further includes:
when the coolant temperature is equal to or higher than the predetermined coolant temperature and the exhaust gas temperature is less than the predetermined exhaust gas temperature, partially opening the first flow passage and closing the second flow passage and the third flow passage, and wherein the exhaust gas flows through only predetermined portions of the thermoelectric generation portion.

11. The method according to claim 9, wherein the controlling of the valve further includes:
when the coolant temperature is equal to or higher than the predetermined coolant temperature and the exhaust gas temperature is equal to or higher than the predetermined exhaust gas temperature, fully opening the first flow passage and closing the second flow passage and the third flow passage, and wherein the exhaust gas flows through an entirety of the thermoelectric generation portion.

12. The method according to claim 8, wherein the controlling of the valve includes:
when the coolant temperature is equal to or higher than a coolant overheat temperature and the exhaust gas temperature is equal to or higher than a predetermined exhaust gas overheat temperature, opening the third flow passage and closing the first flow passage and the second flow passage, and wherein the exhaust gas is discharged through the third flow passage.

13. The method according to claim 8, wherein
the thermoelectric generation portion and the heat exchange portion are integrated to form a thermoelectric generation module; and
the thermoelectric generation module is disposed in a housing.

14. The method according to claim 13, wherein the third flow passage is formed in a remaining area except an installation area of the thermoelectric generation module within the housing.

15. A thermoelectric generating apparatus comprising:
a thermoelectric generation portion disposed on a first flow passage, and configured to convert thermal energy of exhaust gas passing through the first flow passage into electrical energy;
a heat exchange portion disposed on a second flow passage, and configured to heat coolant through heat-exchange of the coolant and exhaust gas passing through the second flow passage;
a valve configured to selectively open or close the first flow passage and the second flow passage, and thus control a flowing route of the exhaust gas; and
a controller configured to variably control opening or closing of the first flow passage and the second flow passage by controlling the valve according to a temperature of the exhaust gas and a temperature of the coolant.

16. A thermoelectric generating apparatus comprising:
a thermoelectric generation portion disposed on a first flow passage, and configured to convert thermal energy of exhaust gas passing through the first flow passage into electrical energy;
a heat exchange portion disposed on a second flow passage, and configured to heat coolant through heat-exchange of the coolant and exhaust gas passing through the second flow passage;
a third flow passage through which received exhaust is configured to pass without change;
a valve configured to selectively open or close the first flow passage, the second flow passage, or the third flow passage, and thus control a flowing route of the exhaust gas; and a housing configured to include the thermoelectric generation portion, the heat exchange portion, and the valve; and a controller configured to variably control opening or closing of the first flow passage, the second flow passage, and the third flow passage by controlling the valve according to a temperature of the exhaust gas and a temperature of the coolant, wherein the third flow passage is formed in a remaining area except an installation area of the thermoelectric generation portion and the heat exchange portion within the housing.

\* \* \* \* \*